United States Patent [19]

Segawa et al.

[11] Patent Number: 4,499,384
[45] Date of Patent: Feb. 12, 1985

[54] IMAGE SENSING DEVICE

[75] Inventors: Hideo Segawa, Tokyo; Koji Mori, Yokohama; Masanori Itagaki; Kohichi Sakurai, both of Kawasaki; Tatsumi Ishiwata, Zushi, all of Japan

[73] Assignee: Ricoch Company, Ltd., Tokyo, Japan

[21] Appl. No.: 269,863

[22] Filed: Jun. 3, 1981

[30] Foreign Application Priority Data

Jun. 11, 1980 [JP] Japan ................................. 55-77855

[51] Int. Cl.³ ............................................. H01J 40/14
[52] U.S. Cl. .................................. 250/578; 250/211 J; 358/213
[58] Field of Search ............... 250/211 J, 578; 357/30, 357/31, 32, 4; 358/212, 213

[56] References Cited

U.S. PATENT DOCUMENTS

| | | | |
|---|---|---|---|
| 3,458,689 | 7/1969 | Lynch | 250/578 |
| 3,488,508 | 1/1970 | Weimer | 250/578 |
| 3,488,636 | 1/1970 | Dyck | 357/32 |
| 3,900,716 | 8/1975 | Kawabata et al. | 250/211 J |
| 4,320,302 | 3/1982 | Stein | 250/578 |
| 4,321,462 | 3/1982 | Numata | 250/211 J |
| 4,369,372 | 1/1983 | Yoshioka et al. | 357/32 |

*Primary Examiner*—David C. Nelms
*Attorney, Agent, or Firm*—Guy W. Shoup

[57] ABSTRACT

A one-to-one image sensing device having a plurality of photo-receiving elements formed on a substrate in a single array is provided. Each of the photo-receiving elements includes a photodiode and a blocking diode which are connected in series and opposite in direction. These photo-receiving elements are manufactured by the well-known thin-film technology. The photo-receiving elements are grouped into blocks each of which has a predetermined number of photo-receiving elements which are commonly connected on one side. A single shift register is commonly connected to the other side of each of said blocks. A MOS transistor switch is provided between the common junction of each of said blocks and an output terminal of the image sensing device.

17 Claims, 25 Drawing Figures

IMAGE SENSING DEVICE

BACKGROUND OF THE INVENTION

1. Field of the Invention

This invention relates to an image sensing device for converting light signals into electrical signals. More in particular, the present invention relates to such an image sensing device including a plurality of photo-sensors arranged in the form of an array to be used in a facsimile system for reading light information.

2. Description of the Prior Art

Heretofore, solid-state image sensing devices have been greatly used as a reader for converting light image information into electrical signals for further processing or for the ease of transmission to a remote place. Conventional solid-state image sensing devices have been manufactured with the use of charge coupled devices (CCD) or Metal-Oxide-Semiconductor (MOS) devices. In other words, a conventional solid state image sensor had a structure in which a plurality of photo-receiving elements or picture elements were formed in the form of an array on the surface of a semiconductor substrate, thereby each of the photo-receiving elements outputting electrical signals in response to the amount of light impinged thereon. The plurality of photo-receiving elements were customarily formed by CCD or MOS elements with application of the well-known semiconductor device manufacturing technology.

These conventional image sensors with CCD or MOS elements are advantageous in the case where photo-receiving elements of high integration are required in a small area. However, the smallness of these conventional image sensors is disadvantageous in certain applications where an original to be scanned by an image sensor is relatively large. This is particulary true for a facsimile system which sometimes requires to read an original having the size of DIN A4 or B4.

Thus, when use is made of these conventional image sensors, a separate optical system must be combined to compensate the smallness of the conventional sensors for practical use. Such a combination then requires complicated optical adjustments and it also requires a high-precision alignment between the image sensors and the optical system. Since an optical system including lenses is used to form a highly reduced image, it tends to create distortion in the peripheral portion of the image which, in turn, lowers the resolving power. Moreover, such an optical system requires a long optical path which hinders to make the whole system compact in size. For example, given that an original to be read has A4 size (210 mm) and a sensor for reading the original has the size of 20 mm with the reduction rate of 10 to 1, if use is made of a lens having the focal distance of 50 mm, then the optical distance from the original to the sensor results in the length of 600 mm, which necessarily makes the whole system bulky. It is also to be noted that the cost of an optical system including lenses cannot be significantly lowered, and wiring of CCD or MOS image sensors calls for high-level skills, which, in turn, can be a cause for pushing up the cost.

Another conventional approach was to construct a one-to-one image sensor which could read an original image as it is without magnification or reduction. Such a conventional one-to-one image sensor is diagrammatically illustrated in FIG. 1, and it comprises a plurality (e.g., 1,728) of photodiodes 2 formed in a single array on the surface of a substrate or base plate 1 and a plurality (e.g., 54) of custom-made IC chips 5, each of which includes a 32-bit shift register 3 and a plurality of MOS transistors 4 connected to respective outputs of the shift register 3.

In operation of such a one-to-one image sensor, a clock pulse is applied to the shift registers 3 to turn the MOS switches 4 on sequentially from one to another. When a particular MOS switch 4 is turned on, the photodiode 2 connected to the MOS switch 4 thus turned on is reverse-biased by a voltage source 6 through a resistor 7, thereby charges are accumulated at the PN junction of the photodiode 2 in question. Then the charge-accumulated photodiode 2 is exposed to a light image L to discharge in response to the received amount of light during a period while the clock pulse completes one scanning cycle. When the MOS switch 4 is turned on again by the clock pulse, the photodiode 2 is recharged to compensate the amount of discharge due to light exposure, whereby an output signal is taken from this recharging current. This mode of operation ensures high sensitivity and high speed operation and is often referred to as the "charge accumulation mode" in this field of technology.

It is true that the prior one-to-one image sensor shown in FIG. 1 is advantageous because it requires no additional optical system in reading a light image. However, it is not free from disadvantages because it structurally requires so many expensive IC chips 5. Furthermore, when mounting these IC chips 5 onto the substrate 1, wiring of the IC chips 5 to the photodiodes 2 and other peripheral circuits are quite complex and expensive, which could push up the manufacturing cost to the same level as that of CCD image sensors.

SUMMARY OF THE INVENTION

This invention overcomes the drawbacks of the prior art devices and provides a one-to-one image sensing device which does not call for the provision of an additional optical system and which is simple in structure and easy to manufacture.

In accordance with the principles of the present invention, a one-to-one image sensing device comprises a plurality of photo-receiving elements arranged in a single array on the surface of a substrate, each of said photo-receiving elements including a photodiode and a blocking diode which are connected in series and opposite in polarity. This allows to cut down the number of expensive shift registers and MOS switches to be provided. In other words, since a blocking diode is provided in series with a photodiode in a particular manner, it is now possible to divide the total number of photo-receiving elements into a plurality of blocks; each block has a predetermined number of photo-receiving elements which are commonly connected. Thus, it is only necessary to use a single shift register having at least so many outputs corresponding to the number of detectors in each block and to use a single MOS switch for each of the block of photo-receiving elements.

Preferably, photo-receiving elements of the present image sensing device are manufactured by the thin-film technology. That is, a one-to-one image sensing device of the present invention is relatively large in size because it is intended to read an original image of A4 or B4 size. Even if such a sizable length is involved, the application of the thin-film technology permits to form all of the required photo-receiving elements on a substrate at the same time in a batch process, thereby assuring the uniform photo-electric characteristics throughout all of the photo-receiving elements.

Thin-film photo-receiving elements of the present image sensor are preferably formed by three thin-films each comprised of CdS, CdTe and Te, thereby a hetero junction is defined between CdS and CdTe thin-films to form a photodiode; whereas, CdS and Te thin-films form a blocking diode with a PN junction at their boundary. In order to improve characteristics, it is preferable to subject the CdS thin-film of the photodiode to heat treatment; on the other hand, the CdS thin-film of the blocking diode is better not to be heat-treated. When forming a photodiode by overlying thin-films of CdS, CdTe and Te one on another, it is preferable to control the timing of heat treatment, especially as to what stage heat treatment should be carried out.

It will be easily understood that a one-to-one image sensing device of the present invention may be operated in the charge accumulation mode for a high speed operation. In order not to hamper this, the photodiode of a photo receiving element should have a substantially larger junction capacitance than that of the blocking diode. Preferably, the ratio between the photodiode junction capacitance $C_P$ and the blocking diode junction capacitance $C_B$ is in the range between 50 and 100.

It is, therefore, an object of the present invention to provide an image sensing device for converting light signals into electrical signals which is simple in structure, thus requiring only a minimum number of components and easy to manufacture at a substantially low cost.

It is another object of the present invention to provide a one-to-one image sensing device which requires no provision of an additional optical system, thus enabling to make the whole system compact in size.

It is a further object of the present invention to provide an image sensing device comprising a plurality of photo-receiving elements each of which includes a photodiode and a blocking diode connected in series to the photodiode in the opposite direction, thus allowing to divide the plurality of photo-receiving elements into a certain number of blocks with the use of a single common shift register and a MOS transistor switch for each block.

It is a still further object of the present invention to provide an image sensing device which may be operated in the charge accumulation mode for a high speed operation with the increased speed.

It is a still further object of the present invention to provide an image sensing device comprising a plurality of photo-receiving elements each made of thin-films at the same time to insure uniform characteristics of each element.

It is still a further object of the present invention to provide an image sensing device having improved photodiodes.

Other objects, advantages and novel features of the present invention will become apparent from the following detailed description of the invention when considered in conjunction with the accompanying drawings.

DESCRIPTION OF THE PREFERRED EMBODIMENTS

Figure 1:
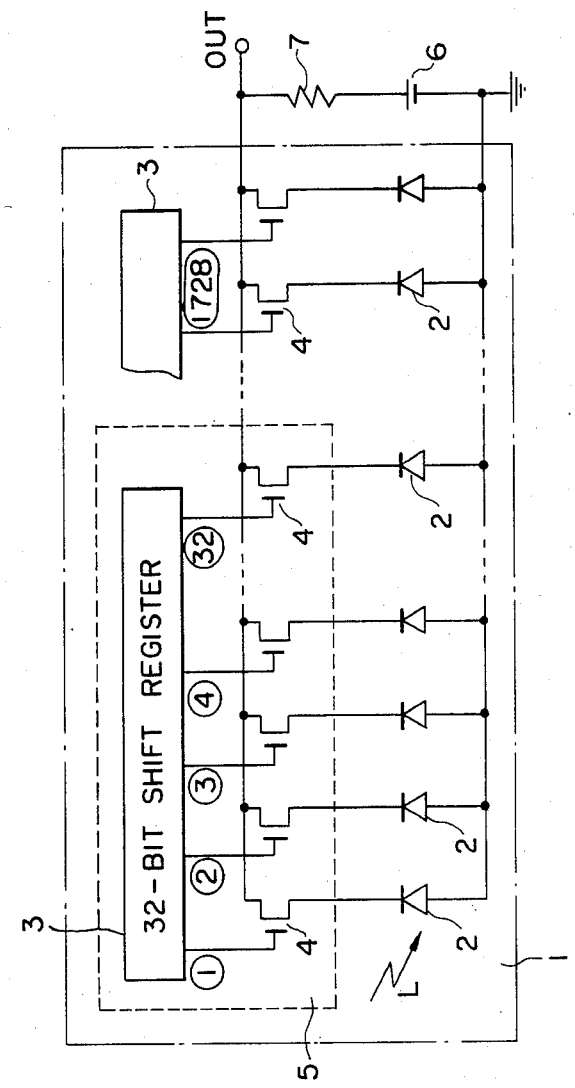
FIG. 1 is a circuit diagram showing a part of the prior art one-to-one image sensing device.

Now, explanation will be had with respect to embodiments of the present invention with particular reference to FIGS. 2 through 14 wherein the same reference numerals indicate the same elements.

Figure 2:
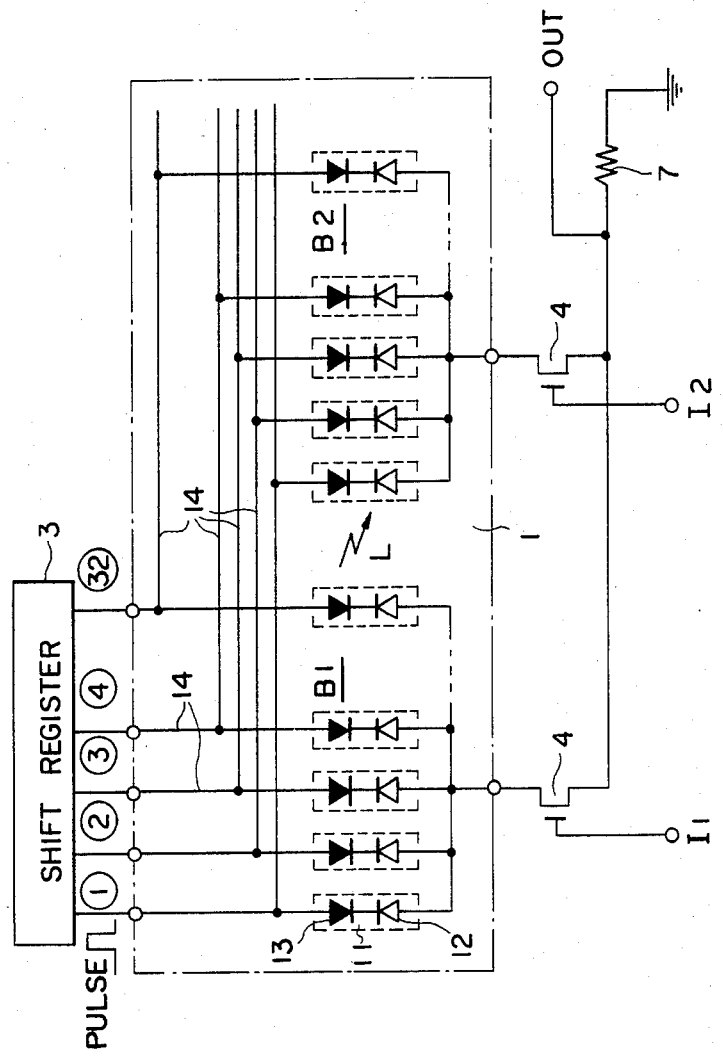
FIG. 2 is a circuit diagram showing a part of a one-to-one image sensing device embodying the principles of the present invention.

Referring to FIG. 2, showing a one-to-one image sensing device embodying the present invention, a plurality of photo-receiving elements 11 are formed in a single array on the surface of a substrate or a base plate 1. Typically, 1,728 photo-receiving elements 11 are provided in order to encompass the sizable length of an original to be read with a reasonable resolving power. These photo-receiving elements 11 are divided into a certain number of blocks each of which has a predetermined number of commonly connected photo-receiving elements 11. In FIG. 2, only two such blocks B1 and B2 are shown. In the case of the embodiment shown in FIG. 2, there are 54 blocks since each block has 32 photo-receiving elements 11. It should be noted that there is provided only a single 32-bit shift register 3 each bit of which is connected to one side of the corresponding photo-receiving element 11 in each of the blocks by means of leads 14. The opposite sides of the elements 11 in each block are commonly connected and it should also be noted that a single MOS transistor switch 4 is connected between the common junction of each of the blocks and an output terminal.

It is to be noted that the photo-receiving element 11 of the present invention comprises a photodiode 12 and a blocking diode 13 which are connected in series and opposite in polarity. Accordingly, each of the photo-receiving elements 11 which are commonly connected at one side in the same block may be operated independently without interfering with the other commonly connected elements 11. As will be described hereinbelow, these photo-receiving elements 11 may be advantageously formed by the application of the thin-film technology in order to assure uniform photo-electric characteristics throughout the array.

Figure 3A:
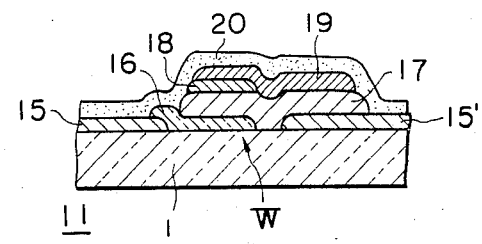
FIGS. 3(A), 3(B), 3(C) and 3(D) are cross-sectional views illustrating several embodiments of a photo-receiving element of the present image sensing device.

Referring to FIGS. 3(A) through 3(H), which illustrate several embodiments of the photo-receiving element 11 of the present image sensing device, all of the elements 11 are formed by thin-films. As shown in FIG. 3(A), on the top surface of a transparent substrate 1, preferably of glass, are formed a pair of metal electrode films 15 and 15', preferably of Cr-Au, spaced apart one from another to define a reading window W therebetween. A transparent electrode film 16, preferably of $SnO_2$ or $In_2O_3$, is formed on the top surface of the substrate 1 partly extending in the window W and partly extending over the metal electrode film 15. A CdS thin-film 17 is formed to bridge between the transparent electrode film 16 and the other metal electrode film 15'. A CdTe thin-film 18 is formed on that portion of the CdS film 17 that is located above the transparent electrode film 16. Overlying on the CdS film 17 and the CdTe film 18 is formed a Te thin-film 19. The whole surface may be covered by a protective layer 20, preferably of $SiO_2$.

Figure 3B:
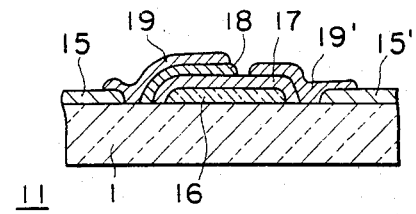
Figure 3E:
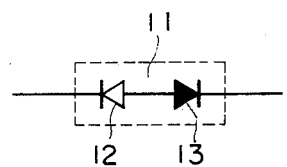
FIGS. 3(E), 3(F), 3(G) and 3(H) are equivalent circuits of the embodiments shown in FIGS. 3(A) through 3(D), respectively.
Figure 3F:
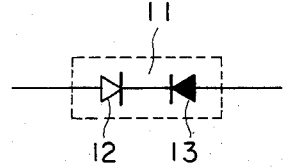

Thus, as shown in FIG. 3(E), which is an equivalent circuit of the element 11 shown in FIG. 3(A), the photodiode 12 is formed by the overlying thin-films of CdS 17, CdTe 18 and Te 19 in which the boundary between CdS film 17 and CdTe film 18 defines a hetero junction exhibiting photodiode characteristics. On the other hand, the blocking diode 13 is formed by the adjoining portion of CdS film 17 and Te film 19.

A second embodiment of the photo-receiving element 11 is shown in FIG. 3(B). In this case, as different from the first embodiment of FIG. 3(A), the transparent electrode 16 is formed on the surface of the transparent substrate 1 located within the window and isolated from either of the metal electrode films 15 and 15'. The CdS film 17 is formed totally overlying on the transparent electrode film 16, and the CdTe film 18 is formed partly on the CdS film 17. The Te film is divided into two portions 19 and 19', one of which extends over the CdTe film 18 and also partly over the metal film 15 with the other portion 19' bridging between the CdS film 17 and the other metal film 15'. As a result, the photodiode 12 is formed by the overlying structure of CdS film 17, CdTe film 18 and Te film 19; whereas, the blocking diode 13 is formed by the overlying structure between CdS film 17 and Te film 19'.

Figure 3C:
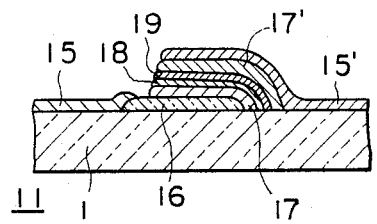

A third embodiment of the photo-receiving element 11 is shown in FIG. 3(C), which is formed by overlying CdS film 17, CdTe film 18, Te film 19 and another CdS film 17' one on another in the order mentioned between the transparent film 16 and the metal film 15'. Thus, the photodiode 12 is formed by the overlying structure of CdS film 17, CdTe film 18 and Te film 19, and the blocking diode 13 is formed by the adjoining Te 19 and CdS 17' films.

Figure 3D:
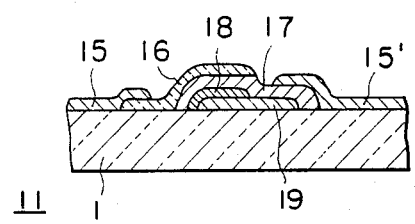
Figure 3G:
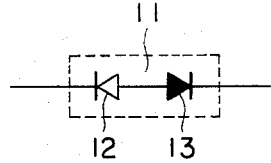
Figure 3H:
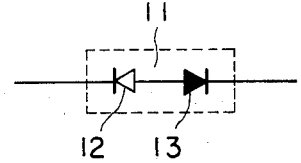

FIG. 3(D) shows a fourth embodiment of the photo-receiving element 11. A remarkable difference of this embodiment as compared with the first three is that the transparent film 16 is located on top, which allows to irradiate light from the above, which, in turn, allows to use a non-transparent material for the substrate 1. Otherwise, this is simply an inverted structure of the first embodiment of FIG. 3(A).

As an example, a method for manufacturing the photo-receiving element of FIG. 3(A) will be explained hereinbelow. Upon forming the metal electrode films 15 and 15' of Cr-Au on the surface of the glass plate 1 of, for example, Corning #7740, the transparent electrode 16 of $SnO_2$ is formed by electron beam evaporation to the thickness of approximately 2,000 angstroms. Then, the CdS film 17 is formed by sputtering to the thickness of 4.7 $\mu$m partly extending over the films 16 and 15' with the substrate temperature 300° C. Therefore, the CdTe film 18 is formed by evaporation to the thickness of 1.5 $\mu$m with the substrate temperature 250° C. Then, the thus formed device is subjected to heat treatment at 500° C. in Ar atmosphere. Finally, the Te film 19 is formed by evaporation to the thickness of 4,000 angstroms with the substrate at room temperature. If desired, the protective film 20 may be made from $SiO_2$ by any conventional film forming technology.

Figure 4A:
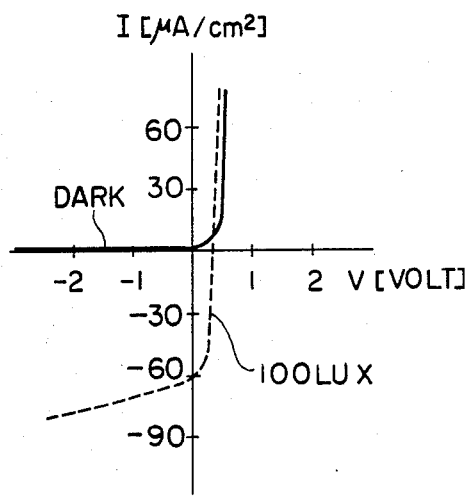
FIGS. 4(A) and (B) are graphs showing the typical I-V characteristics of the photodiode and the blocking diode, respectively, in the present image sensing device.
Figure 4B:
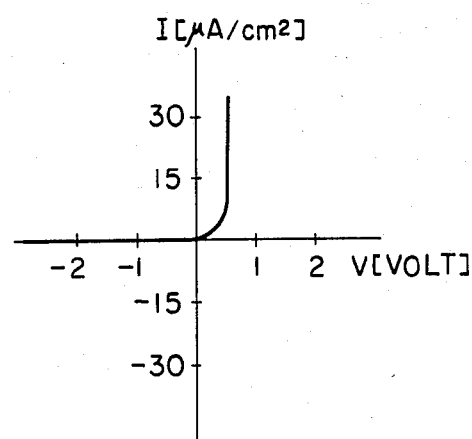

FIGS. 4(A) and 4(B) show I-V characteristics of the photodiode 12 and the blocking diode 13 of the thus manufactured photo-receiving element 11, respectively. As shown in FIG. 4(A), the photodiode 12 exhibits rectifying properties as well as photosensitivity; whereas, the blocking diode 13 exhibits only rectifying properties as shown in FIG. 4(B). In order to improve characteristics of the blocking diode 13, it is necessary to lower the forward voltage drop, which may be effectively envisaged by reducing the resistivity of the CdS film 17. One approach to reduce the resistivity of the CdS film 17 is to carry out sputtering by using a target doped by Cl, I, etc., or more practically $CdCl_2$ or $CdI_2$.

Photo-electric characteristics of the present photo-receiving element 11 may be further improved in the following manner. In the case of the photo-receiving element 11 shown in FIG. 3(C), there are two separate CdS films 17 and 17'. In such a structure, if the CdS film 17 of the photodiode 12 is subjected to heat treatment, the dark current is reduced thereby increasing photosensitivity; if the CdS film 17' of the blocking diode 13 is not heat-treated, the forward voltage drop and the reverse current remains smaller. Therefore, it is preferable to heat-treat the CdS film 17 of the photodiode 12 only and not the CdS film 17' of the blocking diode 13. This is because, when heat is added to the CdS film 17, CdS crystal particles or grains become larger and the surface of the CdS film, where it tends to be Cd rich, is oxidized to present increased resistivity. This allows to provide an improved photodiode having a smaller dark current and a higher sensitivity. On the other hand, the CdS film 17' forming a part of the blocking diode 13 had better be not subjected to heat treatment since the resistivity goes up due to oxidation if heat-treated. Without heat treatment, the forward voltage drop of the CdS film 17' stays low since the forward resistance stays at a low value.

The above concept may also be applied to the elements 11 shown in FIGS. 3(A), (B) and (D) as long as the CdS film 17 in these elements 11 is split into two separate parts: one part for the photodiode 12 and the other part for the blocking diode 13. This may be easily done, for example, by dividing the process for forming the CdS film 17 into two steps. That is, a CdS film portion forming a part of the photodiode 12 is first formed and heat-treated, and, then, a second CdS film portion forming a part of the blocking diode 13 is formed and not subjected to heat treatment thereafter.

Figure 5:
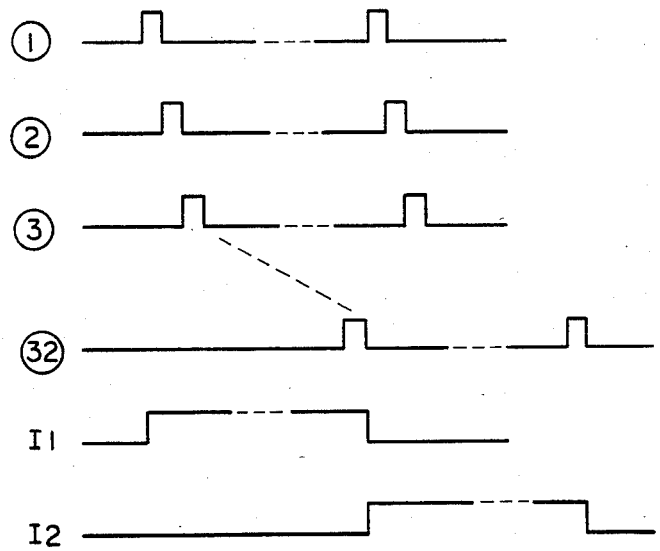
FIG. 5 is a timing diagram showing the relationship between the clock pulse applied to the common shift register and the pulses applied to the gates of the MOS switches in the device shown in FIG. 2.

Explanation will now be had with respect to the operation of the present image sensing device shown in FIG. 2 in conjunction with the timing diagrams shown in FIG. 5.

The 32-bit shift register 3 in FIG. 2 outputs pulses sequentially as shown in FIG. 5, and this is repeated in a cyclic fashion. In synchronism with the output pulses from the shift register 3, gate pulses are supplied from gate pulse input terminals I1, I2, etc. to the gates of the MOS switches 4 in sequence, as shown in FIG. 5, to turn the MOS switches 4 on sequentially. The MOS switch 4 for a particular block, say B1, is kept on during the period in which all of the photo-receiving elements 11 in the block B1 are once supplied with the pulse from the shift register 3. Therefore, all of 1,728 photo-receiving elements 11 arranged in a single array are scanned from one end to the other by the output pulses from the single shift register 3.

If the pulse appears on the output ① the shift register 3 while the MOS switch 4 of the block B1 is turned on, the output pulse is supplied to the left-most element 11 thereby charges are accumulated in the photo-diode 12. Then, if the thus charged left-most element 11 receives light during the time in which the output pulses are supplied to the other elements 11 for charging, the photodiode 12 discharges in response to the amount of light received by the element 11 in question. Then, when the pulse is again supplied to this element 11 in question, the photodiode 12 is recharged by the amount of discharge. This recharging current passing through the resistor 7 is taken from the output terminal as a video signal.

As above described, it will be easily understood that the present image sensing device shown in FIG. 2 may be operated in the charge accumulation mode. Supposing that there are 1,728 photo-receiving elements 11 arranged in a single array and use is made of a single 32-bit shift register, it is only necessary to provide 54 MOS switches in accordance with the present invention. Moreover, the present invention does not require a special IC chip as in the prior art, and general purpose shift register and MOS transistors may be used. Since fewer shift registers and MOS switches are used, the number of wirings is effectively reduced, which, in turn, could contribute to significantly lower the assembly cost. Besides, tape assembly type multilayer lead lines using a plastic film may be preferably used for leads 14 to further facilitate the manufacturing process.

In the embodiment described above, the photodiode 12 of the photo-receiving element 11 is formed by the overlying structure of CdS-CdTe-Te, and the blocking diode 13 is formed by the CdS-Te overlying structure. It should however be noted that the photodiode 12 may be made from other materials including II-VI group compounds such as ZnS-ZnTe, CdS-CdSe and CdSe-CdTe, amorphous chalcogenides such as As-Se-Te and Se-Te, combinations of II-VI group compounds such as CdS-CdTe-As$_2$Se$_3$ and amorphous chalcogenides, and amorphous silicon.

Next, several preferred methods for manufacturing a photodiode to be used in the present image sensing device will be described.

When forming a photodiode on a substrate, it has been found that when to carry out heat treatment in the manufacturing process to improve photo-electric characteristics is rather important. In other words, when a photodiode is manufactured by thin-films, it is rather important to control that which part should be heat-treated and which part should not. Here, it is contemplated to form a photodiode by overlying a CdS film, a CdTe film and a Te film one on another. For such a photodiode, the conventional approach was to carry out heat treatment for the whole device after formation of the three layer structure. Thus, in accordance with the conventional method, the Te film is also heat-treated, which is disadvantageous because it can be a cause of the increased dark current when a CdS-CdTe system photo-electric element is to be used as a photodiode. Moreover, heat-treated Te film tends to deteriorate the switching characteristics of a diode.

The present invention provides several methods for manufacturing photodiodes which have a smaller dark current under reverse bias and an appropriate photo-current under illumination, and which have improved photoresponse characteristics.

One preferred method for manufacturing a photodiode to be used in the present image sensing device which comprises forming a transparent conductive film on a transparent substrate, forming a CdS film, a CdTe film and a Te film on said transparent conductive film in the order mentioned, and then forming an opposite electrode on said Te film is that no heat treatment is effected at any point after the formation of the CdS film, after the formation of the CdTe film, or after the formation of the Te film. This preferred method will be described further in detail with reference to FIG. 6.

Figure 6:
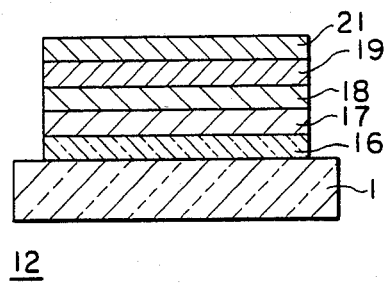
FIG. 6 is a cross-sectional view of a photodiode to be used in the present image sensing device of FIG. 2.

As shown in FIG. 6, the transparent conductive film 16 is formed on the transparent substrate 1 by spraying, sputtering, evaporation, or the like. The film 16 may be made of a material such as In$_2$O$_3$, SnO$_2$ and oxides of In-Sn. A material for the substrate 1 includes soda glass, quartz glass, boron-silicon glass and plastics, but it is to be noted that selection may be made from a wide variety of materials which allow transmission of light.

Upon formation of the transparent conductive film 16 on the substrate 1, the CdS film 17 is formed to the thickness of 0.5–10 $\mu$m, preferably 1–5 $\mu$m by sputtering or evaporation. At this time, the substrate 1 is desirably maintained at 150°–600° C., preferably 200°–400° C. It is, however, important that heat treatment is not effected after formation of the CdS film 17.

Then, on the CdS film 17 is formed the CdTe film 18 to the thickness of 0.2–5 $\mu$m, preferably 1–3 $\mu$m, by sputtering or evaporation. It is desirable to maintain the substrate 1 at 150°–300° C. during this step. It is to be noted that no heat treatment is carried out after formation of the CdTe film 18.

It then follows that the Te film 19 is formed on the CdTe film 18 to the thickness of 1,000 angstroms—3 $\mu$m by sputtering or evaporation with maintaining the substrate 1 at the temperature not exceeding 500° C., preferably between room temperature and 200° C. Again, heat treatment is not carried out after formation of the Te film 19.

Finally, an ohmic electrode 21 is formed on the Te film 19 by deposition of Au, Al, Ni or Cr to complete the process of manufacturing the photodiode 12.

A photodiode manufactured by the above-described method, which had a 5 $\mu$m thick CdS film and 0.7 $\mu$m thick CdTe film, exhibited the dark current of 11 nA and the photo-current of 0.65 μA and, therefore, the ratio of photo-current to dark current was equal to 59. Another photodiode manufactured by the above-described method, which had a 5 μm thick CdS film and a 1.5 μm thick CdTe film, exhibited the dark current of 0-1 nA and the photo-current of 0.83 μA and, therefore, the ratio of photo-current to dark current gave the values between 830 and infinity. For either of the above two examples, the surface area of either of the photodiodes was 3 mm², and the dark currents were measured with a reverse bias of 1.8 V; whereas, the photo-currents were measured with a reverse bias of 1.8 V under the illumination of 100 luxes.

As regards the first photodiode having a 5 μm thick CdS film and a 0.7 μm thick CdTe film, the saturation illumination amount was 0.6 lux.sec and the saturation charge amount (time constant) was 2321 (2.9 μsec), and, therefore, the sensitivity defined by the ratio of the saturation charge amount to the saturation illumination amount gave the value of 3.9 nA/lux. Similarly, as regards the second photodiode having a 5 μm thick CdS film and a 1.5 μm thick CdTe film, the saturation illumination amount was 0.4 lux.sec and the saturation charge amount was 940 (1.2 μsec), and, therefore, the sensitivity gave the value of 2.0 nA/lux.

Figure 7:
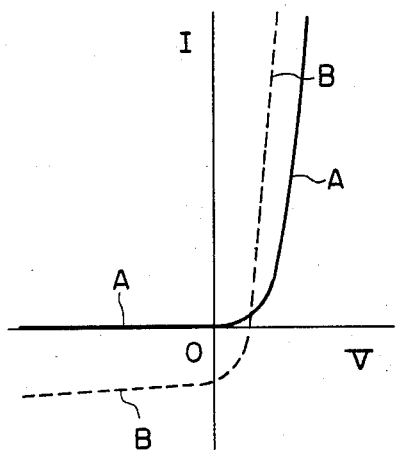
FIG. 7 is a graph showing the typical I-V characteristics of the photodiode of FIG. 6.
Figure 8A:
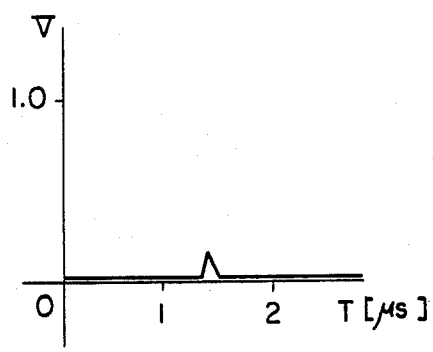
FIGS. 8(A) and (B) are graphs showing the output characteristics of the photodiode of FIG. 6 when operated in the storage mode.
Figure 8B:
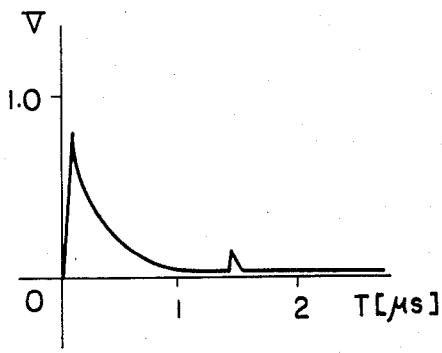

Typical electrical characteristics of the photodiodes manufactured in accordance with the above-described method are shown in FIGS. 7, 8(A) and 8(B). FIG. 7 shows I-V characteristics in which the solid line A represents the case without illumination and the dotted line B represents the case with illumination. FIGS. 8(A) and 8(B) show output wave shapes in the storage mode operation without and with illumination, respectively. As may be easily understood from those Figures, the photodiodes munufactured in accordance with the above-described method show excellent I-V characteristics and, more importantly, the output current is virtually zero under no illumination condition, which indicates to present excellent blocking characteristics. Since none of CdS, CdTe and Te films constituting a photodiode is heat treated in the above-described method, it is possible to prevent the Te film from receiving undesired thermal effects, which, in turn, contributes to avoid increase in dark current and deterioration of switching characteristics.

Now, a second preferred method for manufacturing a photodiode to be used in the present image sensing device will be described hereinbelow. Here, again, the basic structure of a photodiode to be manufactured is the same as that of the first example. The characteristic feature of this second method as different from the first method is that heat treatment is carried out after formation of the CdS film and/or after formation of the CdTe film in the oxygen contained atmosphere. Thus, this second method proposes to carry out heat treatment at least once at a specified point of time during the process of manufacturing a photodiode. Further details of this second method will be disclosed below with reference to FIG. 6.

Similarly with the first method, the transparent conductive film 16 may be formed on the transparent substrate 1.

The CdS film 17 may be formed on the transparent conductive film 16 in the similar manner as in the first method. However, it is preferable that Ar pressure is set at $3 \times 10^{-1}$ torr or less during the formation of the CdS film 17. Impurities selected from group VII elements such as Cl, Br and I or group III elements such as Al, Ga and In may be contained in CdS. If the CdS film 17 is to be heat-treated, it is carried out for 10 to 60 minutes in the oxygen contained atmosphere at 700° C. or less, preferably 300°–600° C. Preferably, the oxygen contained atmosphere includes an inert gas, such as Ar, Ne, He or $N_2$, and oxygen, but the air contained atmosphere is equally applicable.

Then, similarly with the first method, the CdTe film 18 is formed on the CdS film 17. If the CdTe film 18 is to be heat-treated, it is carried out in the oxygen contained atmosphere at 100°–700° C., preferably 300°–600° C.

Thereafter, similarly with the first method, the Te film 19 is formed on the CdTe film 18. It is preferable that no heat treatment is effected subsequent to the formation of the Te film 19.

Finally and similarly with the first method, the electrode 21 is formed on top to complete the manufacturing process.

Several photodiodes have been manufactured in accordance with the above-described second method and experiments have been conducted to take some measurements to check their characteristics. The results of the experiments are tabulated in the following Tables I and II.

Table I shows the measured dark and photo-currents when the thickness of a CdTe film was varied from 0.7 to 1.6 μm with a 5 μm thick CdS film and with or without heat treatment. All the photodiodes used for measurements had the surface area of 3 mm². The dark currents were measured with a reverse bias of 1.8 V, and the photo-currents were measured with a reverse bias of 1.8 V and under the illumination of 100 luxes.

Table II shows the measured saturation illumination amounts and saturation charge amounts for the same photodiodes employed in the current mesurements under the conditions of 5 volt bias and 100 lux illumination. The calculated sensitivities are also shown.

TABLE I

Relationship Between Heat-Treatment Conditions and Photo-Electric Characteristics

| CdS Film Heat-Treatment Air 500° C. 30 min. | CdTe Film Thickness (μm) | CdTe Film Heat-Treatment Ar + O₂ 500° C. 30 min. | Dark Current (nA) | Photo-Current (μA) | Dark Current / Photo Current |
|---|---|---|---|---|---|
| With | 0.7 | Without | 450 | 6.6 | 15 |
| With | 0.7 | With | 1-0 | 1.65 | 1650-∞ |
| Without | 0.7 | With | 100 | 2 | 20 |
| With | 1.6 | Without | 137 | 0.74 | 5.4 |
| With | 1.6 | With | 1-0 | 1.8 | 1800-∞ |
| Without | 1.6 | With | 10 | 2.5 | 250 |

TABLE II

Relationship Between Heat-Treatment Conditions and Sensitivities

| CdS Film Heat-Treatment air 500° C. 30 min. | CdTe Film Thickness (μm) | CdTe Film Heat-Treatment Ar + O$_2$ 500° C. 30 min. | Saturation Illumination Amount (lux.sec) | Saturation Charge Amount (time constant) | Sensitivity (nA/lux) |
| --- | --- | --- | --- | --- | --- |
| With | 0.7 | Without | 0.3 | large leakage (1.8 μsec) | — |
| With | 0.7 | With | 0.1 | 884 (1.2 μsec) | 8.8 |
| Without | 0.7 | Without | 0.6 | 2321 (2.9 μsec) | 3.9 |
| Without | 0.7 | With | 0.1 | large leakage (2 μsec) | — |
| With | 1.6 | Without | 0.3 | some leakage (1.15 μsec) | 1.6 (E = 3V) |
| With | 1.6 | With | 0.15 | 982 (1.3 μsec) | 6.5 |
| Without | 1.6 | With | 0.06 | 940 (1.2 μsec) | 16.0 |

As is apparent from Table I, when the CdS film is heat-treated, photo-electric characteristics, i.e., photo-currents/dark currents, are improved, and, in particular, the dark currents are remarkably reduced. The heat-treated CdTe film causes to increase the photo-current. As shown in Table I, the thicker the CdTe film, the smaller the dark current.

As can be understood from Table II, when the CdS film is heat-treated, the time constant becomes smaller and the photo-response becomes faster. The heat-treated CdTe film helps to reduce the saturation illumination amount, which, in turn, contributes to increase sensitivity.

As mentioned before, an image sensing device of the present invention may be operated in the charge accumulation mode. However, since the photo-receiving element 11 of the present device includes a photodiode 12 and a blocking diode 13, which are connected in series and opposite in polarity, it is important that the junction capacitance $C_P$ of the photodiode 12 be smaller than the junction capacitance $C_B$ of the blocking diode 13. Otherwise, the wave shapes of video output signals are deformed and a high speed operation cannot take place. Moreover, if $C_P$ is not substantially greater than $C_B$, the difference between the dark and light output voltages cannot be recognized. In general, if $C_P/C_B=50$ to 100 is satisfied, excellent photo-electric characteristics can be obtained.

The present invention proposes several novel structures to attain the condition of $C_P$ being substatially greater than $C_B$. One such proposed structure is to make an elongated photodiode such that the elongated section extends beyond the window over the metal electrode thereby using the elongated section as a capacitor in parallel with the photodiode section. Detailed description of such an elongated photodiode will be given with particular reference to FIGS. 9(A) and 9(B).

Figure 9A:
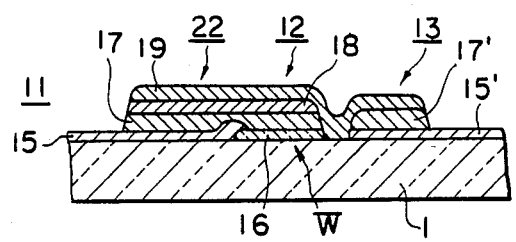
FIG. 9(A) is a cross-sectional view, taken along ling X—X in FIG. 9(B), showing one embodiment of the photo-receiving element including a photodiode and a blocking diode with the increased photodiode junction capacitance.
Figure 9B:
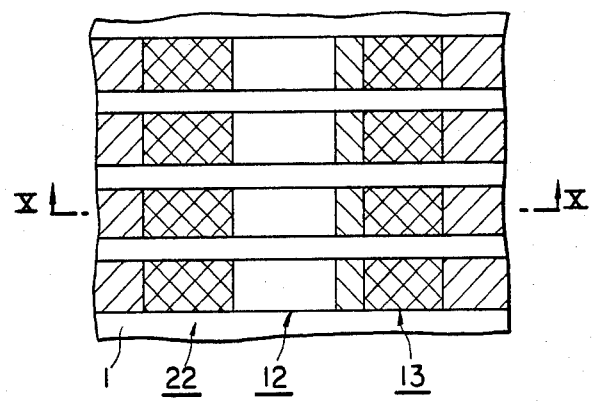
FIG. 9(B) is a top plan view of the embodiment shown in FIG. 9(A)

The structure of the present photo-receiving element 11 having a photodiode 12 with an elongated capacitive section is shown in FIG. 9(A). The structure shown in FIG. 9(A) is virtually the same as that of FIG. 3(A) except two points. That is, the structure of FIG. 9(A) has split CdS films 17 and 17': film 17 forming a part of the photodiode 12 and film 17' forming a part of the blocking diode 13. The other difference is that the films 17, 18 and 19 constituting the photodiode 12 are extended beyond the window W over the metal film 15 to form a capacitor 22 which is connected to the photodiode 12 in parallel.

Figure 10A:
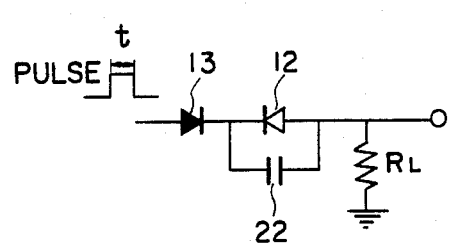
FIG. 10(A) is an equivalent circuit of the embodiment shown in FIGS. 9(A) and (B), but when the CdS films 17 and 17' are doped to represent P conductivity type.
Figure 10B:
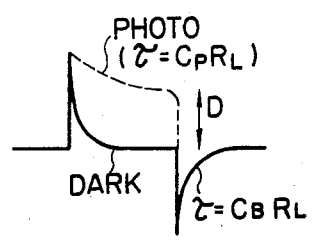
FIG. 10(B) is a waveshape showing the operating characteristics of the embodiment shown in FIGS. 9(A) and (B)
Figure 11:
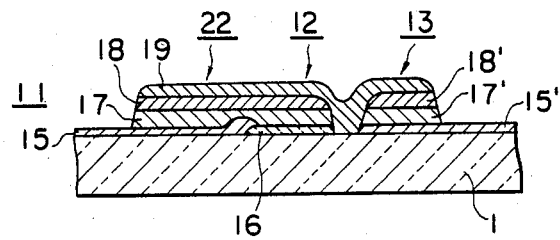
FIGS. 11, 12 and 13 are cross-sectional views showing several other embodiments of the photo-receiving element including a photodiode and a blocking diode with the increased photodiode junction capacitane.

The equvalent circuit of the structure of FIG. 9(A) is shown in FIG. 10(A). As shown, the junction capacitance of the photodiode 12 is effectively increased by the capacitance of the condensor 22. Thus, the effective junction capacitance $C_P$ of the photodiode 12 becomes substantially greater than the capacitance $C_B$ of the diode 13. FIG. 10(B) shows the output wave shape when a pulse with pulse width t is applied to the equivalent circuit of FIG. 10(A). As will be easily understood, the falling portion D of the output pulse may be increased by increasing $C_P$ since the time constant is expressed as $\tau = C_P R_L$. It is to be noted that the blocking diode 13 may have the same structure as that of the photodiode 12 as shown in FIG. 11. In this instance, the CdTe film is split into two sections 18 and 18' and the blocking diode 13 is a CdS-CdTe hetero junction type diode. Besides, the Te film 6 may be substituted by a metal such as Au.

Figure 12:
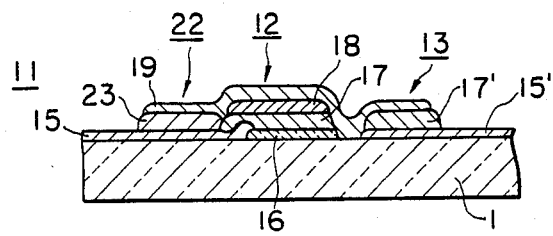

Another proposed structure for increasing the junction capacitance of the photodiode 12 as compared with that of the blocking diode 13 is to form a thin-film condensor with a dielectric material having a high dielectric constant in parallel with the photodiode 12. The effective junction capacitance of the photodiode 12 is increased by this parallel-connected condensor. This structure is shown in FIG. 12.

As shown, there is provided a thin-film condensor 22 adjacent to the photodiode 12 of the present photo-receiving element 11. The condensor 22 is comprised of a dielectric film 23 having a high dielectric constant, which is sandwiched between the metal film 15 and the Te film 19. Such a dielectric film 23 may be formed by a material such as TiO$_2$ ($\epsilon_r \approx 100$), TaTiO$_3$ ($\epsilon_r \approx 200$), LiNbO$_3$ ($\epsilon_r \approx 80$), PbZrO$_3$ ($\epsilon_r \approx 100$), and PbTiO$_3$ ($\epsilon_r \approx 200$). The dielectric film 23 may be formed by any conventional film forming technology such as sputtering and evaporation. Patterning of the film 23 may be carried out by chemical etching method, ion beam etching method, plasma etching method, or a combination thereof. The equivalent circuit of the structure shown in FIG. 12 is the same as that shown in FIG. 10(A). Thus, what was said in connection with FIGS. 10(A) and 10(B) holds equally true in the structure of FIG. 12.

In the above, two different structures are proposed to form a parallel condensor to effectively increase the junction capacitance of the photodiode 12 of the present photo-receiving element 11. The first structure as shown in FIG. 11 is advantageous because it is easy to manufacture. However, since it requires a relatively large surface area, a leakage current could become appreciable, leading to deteriorated capacitor characteristics.

Thus, there is proposed a further structure to improve the characteristics of the parallel capacitor by providing an insulating film between the parallel capacitor section 22 and the metal film 15, thereby the insulating film acting as a barrier to the leakage current.

Figure 13:
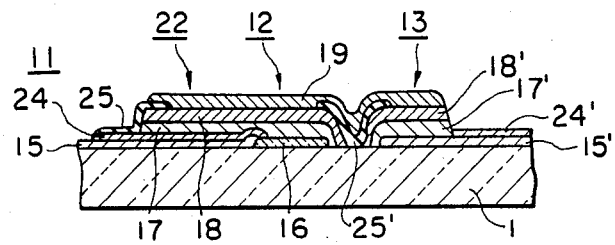

Detailed explanation as to this third structure will be given below with particular reference to FIG. 13. As is obvious, the structure of FIG. 13 is almost the same as that of FIG. 11 except that an insulating film 24 is provided between the parallel condensor 22, comprised of the elongated sections of the CdS 17, CdTe 18 and Te 19 films, and the metal film 15. The provision of this insulating film 24 prevents the occurrence of leakage current and enhances the charge holding characteristics of the capacitor 22. On the metal film 15' is formed another insulating film 24', which may be formed simultaneously with the film 24. The insulating film 24' provides a protective function for the film 15'. Moreover, insulating films 25 and 25' may be provided as shown in FIG. 13. The insulating film 25 is a protective film and the other insulating film 25' prevents the occurrence of short-circuiting between the photodiode 12 and the blocking diode 13.

Figure 14:
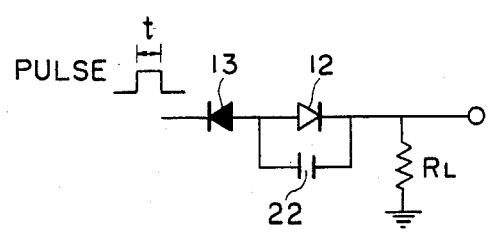
FIG. 14 is an equivalent circuit of the embodiment shown in FIG. 13.

FIG. 14 shows an equivalent circuit of the structure of FIG. 13. This circuit is virtually the same as that of FIG. 10(A) except that both of the diodes 12 and 13 are reversed in direction. Thus, what was said about the circuit of FIG. 10(A) is equally applicable to the circuit of FIG. 14.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. An image sensing device for converting light signals into electrical signals, comprising:
   a substrate;
   a plurality of photo-receiving elements formed on said substrate in a single array and each including a photodiode and a blocking diode which are connected in series and opposite in polarity, said plurality of photo-receiving elements being divided into a certain number of blocks each of which includes a predetermined number of said photo-receiving elements which are commonly connected to a junction on one side;
   a plurality of switching means each connected between the common junction of each of said blocks and an output terminal of said image sensing device;
   pulse outputting means including output terminals for outputting pulse signals; and
   a plurality of leads each connecting one of said output terminals of said pulse outputting means to a side opposite to said one side of the corresponding photo-receiving element of each of said blocks.

2. The device of claim 1 wherein both of said photodiode and blocking diode are made of thin-films.

3. The device of claim 2 wherein said photodiode is comprised of CdS, CdTe and Te thin-films stacked one on another, and said blocking diode is comprised of CdS and Te thin-films stacked one on another.

4. The device of claim 3 wherein the Te thin-film of said photodiode is connected to the Te thin-film of said blocking diode.

5. The device of claim 1 wherein said photo-receiving element further comprises charge accumulation means to increase the effective junction capacitance of said photodiode.

6. The device of claim 5 wherein said charge accumulation means comprises a capacitor connected in parallel to said photodiode.

7. The device of claim 6 wherein said capacitor is formed by an elongated section of said photodiode, said elongated section extending beyond the window and over a metal film.

8. The device of claim 7 wherein an insulating film is provided between said elongated section and said metal film.

9. The device of claim 6 wherein said capacitor comprises a dielectric film having a substantially high dielectric constant, which is disposed adjacent to said photodiode.

10. The device of claim 1 wherein said switching means comprises MOS transistors each having a gate for receiving an actuation pulse applied in synchronism with said pulse signals supplied by said pulse outputting means.

11. The device of claim 10 wherein the pulse width of said actuation pulse is long enough to scan all of said photoreceiving elements in one of said blocks by the output pulse signals from said pulse outputting means.

12. The device of claim 1 wherein said pulse outputting means comprises a shift register which is commonly connected to each of said blocks for supplying output pulse signals in sequence.

13. The device of claim 1 further comprising biasing means for supplying a reverse bias to said photodiode in response to the output pulse signals from said pulse outputting means.

14. A one-to-one image sensing device for reading a light information and producing electrical signals comprising:
   a substrate;
   a plurality of photo-receiving elements formed on said substrate in a single array, each of said elements including a photodiode and a blocking diode which are connected in series and opposite in direction and a capacitor connected in parallel to said photodiode;
   means for supplying a reverse bias to said photodiodes; and
   means for outputting the electrical signals produced by said photodiodes.

15. The device of claim 14 wherein said photodiode is comprised of CdS, CdTe and Te thin-films and said blocking diode is comprised of CdS and Te thin-films.

16. The device of claim 15 wherein the CdS thin-film of said photodiode includes a heat-treated CdS thin-film, whereas the CdS thin-film of said blocking diode includes a non-heat-treated CdS thin-film.

17. The device of claim 14 wherein the junction capacitance of said photodiode is substantially greater than that of said blocking diode.

* * * * *